United States Patent

Peltzer

[15] 3,648,125

[45] Mar. 7, 1972

[54] METHOD OF FABRICATING INTEGRATED CIRCUITS WITH OXIDIZED ISOLATION AND THE RESULTING STRUCTURE

[72] Inventor: Douglas L. Peltzer, Cupertino, Calif.

[73] Assignee: Fairchild Camera and Instrument Corporation, Mountain View, Calif.

[22] Filed: Feb. 2, 1971

[21] Appl. No.: 111,956

[52] U.S. Cl. ............................... 317/235, 317/101, 317/234

[51] Int. Cl. ............................... H01l 19/00

[58] Field of Search ..................... 317/234, 235, 101; 29/576

[56] References Cited

UNITED STATES PATENTS

| | | | |
|---|---|---|---|
| 3,136,897 | 6/1964 | Kaufman | 317/235 X |
| 3,189,798 | 6/1965 | Benjamin | 317/234 |
| 3,210,620 | 10/1965 | Lin | 317/234 |
| 3,210,677 | 10/1965 | Lin et al. | 330/17 |
| 3,474,308 | 10/1969 | Kronlage | 317/235 |
| 3,575,740 | 4/1971 | Castrucci et al. | 148/175 |
| 3,575,741 | 4/1971 | Murphy | 148/175 |

*Primary Examiner*—James D. Kallam
*Attorney*—Roger S. Borovoy, Alan MacPherson and Charles L. Botsford

[57] ABSTRACT

A thin silicon epitaxial layer, formed on a silicon substrate, is subdivided into electrically isolated pockets by a grid of oxidized regions of epitaxial silicon material which extend through the epitaxial layer to a laterally extending PN junction.

24 Claims, 19 Drawing Figures

INVENTOR.
DOUGLAS L. PELTZER

BY

Alan H. MacPherson
ATTORNEY

INVENTOR.
DOUGLAS L. PELTZER

BY

Alan H. MacPherson

ATTORNEY

INVENTOR.
DOUGLAS L. PELTZER
BY
Alan H. MacPherson
ATTORNEY

INVENTOR.
DOUGLAS L. PELTZER

BY

Alan H. MacPherson

ATTORNEY

*INVENTOR.*
DOUGLAS L. PELTZER
BY
Alan H. MacPherson
ATTORNEY

METHOD OF FABRICATING INTEGRATED CIRCUITS WITH OXIDIZED ISOLATION AND THE RESULTING STRUCTURE

BACKGROUND OF THE INVENTION

1. Field of the Invention

This invention relates to semiconductor devices and in particular to integrated circuits of smaller size, higher speed and higher packing density than heretofore obtained, and to the process of making them.

2. Prior Art

Various ways have been proposed to isolate electrically a plurality of pockets of semiconductor material in each of which one or more circuit elements can be formed. Among the ways proposed have been appropriately biased PN junctions (Noyce U.S. Pat. No. 3,117,260 issued Jan. 7, 1964), combinations of PN junctions and zones of intrinsic and extrinsic semiconducting materials (Noyce U.S. Pat. No. 3,150,29 issued Sept. 22, 1964), dielectric isolation (Frescura U.S. Pat. No. 3,391,023 issued July 2, 1968) and mesa etching (Frescura et al. U.S. Pat. No. 3,489,961 issued Jan. 13, 1970). Tucker and Barry, in application Serial No. 845,822 filed July 29, 1969, disclose the use of selectively-doped polycrystalline silicon to help isolate islands of single-crystal silicon in which circuit elements can be formed.

After electrically isolated pockets of semiconductor material are prepared, active and passive circuit elements are formed within or on the pockets. Many of these circuit elements are typically formed using the planar diffusion techniques disclosed by Hoerni in U.S. Pat. Nos. 3,025,589 and 3,064,167. In the planar process, the regions of each semiconductor pocket into which circuit elements are diffused are controlled by forming a diffusion mask from an insulation layer formed on the surface of the semiconductor material. After the desired elements have been formed in the semiconductor material, a conductive lead pattern is formed on the insulation and used to interconnect selected active and passive circuit elements into the desired circuit. Additional passive circuit elements can also be formed on the insulation and interconnected into the circuit. Such a structure is disclosed in Noyce U.S. Pat. No. 2,981,877 issued Apr. 25, 1961.

In the manufacture of integrated circuits, several problems arise. First, the area of the wafer required for the placement of the isolation regions between adjacent pockets of semiconductor material is a significant portion of the total wafer area. A large isolation area reduces the number of devices which can be placed in a wafer and thus lowers the "packing density" of the circuit elements formed in the wafer. Second, the leads formed on, and adherent to, the insulation on the wafer surface sometimes crack at steps in the insulation on the wafer surface. These steps are often quite steep. Third, several of the isolation techniques result in significant capacitances being introduced into the integrated circuit. While at low frequencies these capacitances do not affect the operation of the circuit, at high frequencies these capacitances can have a significant effect on circuit performance. Fourth, the prior art integrated circuits are usually formed in relatively thick (greater than 5 microns) epitaxial layers formed on support substrates. As a result, the operating speeds of the resulting devices are sometimes slower than desired. Fifth, the processes by which prior art integrated circuits are produced are relatively sensitive to defects in masks and to small errors in the sequential placement of masks on the device during the various process steps. Low defect masks, low defect masking procedures and proper alignment of the masks are important factors in obtaining good yields.

To eliminate cracks in the interconnect leads at steps in the insulation, J. S. So in U.S. Pat. No. 3,404,451 issued Oct. 8, 1968 proposes to remove portions of this insulation from the wafer surface during processing. It has also been proposed to slope the edges of the insulation at the contact window. A different approach, disclosed by J. A. Appels, et al. in an article entitled "Local Oxidation of Silicon and its Application in Semiconductor-Device Technology" Philips Research Reports 25 page 118 (1970), is to etch grooves into the semiconductor wafer adjacent those regions in which PN junctions are to be formed. The material exposed by the grooves is then thermally oxidized. If the process is properly controlled, the oxide surface and the surface of the semiconductor material are approximately coplanar. An added advantage of this process, emphasized by Appels et al., is that the portion of the semiconductor wafer in which the impurity is diffused has a mesalike shape. The resulting PN base-collector junction is substantially flat and has a higher breakdown voltage than does a dish-shaped PN junction but still contacts passivating oxide, as in the planar process.

SUMMARY OF THE INVENTION

A thin silicon epitaxial layer, formed on a silicon substrate is subdivided into electrically isolated pockets by a grid of oxidized regions of epitaxial silicon material (hereafter called "oxidized isolation regions"). These regions are oxidized through the epitaxial layer to a laterally extending isolation PN junction (hereafter called the "isolation PN junction").

At least one side of this isolation PN junction has a resistivity and conductivity type determined by dopants from the substrate. Usually this junction is not coextensive with the metallurgical interface between the epitaxial silicon layer and the underlying silicon substrate. Rather, during the formation of the epitaxial layer, the position of the isolation PN junction is determined by dopant concentrations, diffusion constants, and process parameters. Its ultimate position is also influenced by the subsequent processing of the wafer.

The isolation PN junction may be made up of a series of PN junctions including PN junctions between buried layers in the substrate and the substrate itself. The isolation PN junction defines a surface which may extend into both the epitaxial layer and the substrate. Each pocket of silicon is isolated by a portion of the isolation PN junction and portions of the oxidized isolation regions.

Each such pocket can contain active devices, passive devices or both. Crossunder regions of low resistivity can be formed in the substrate to interconnect regions separated by at least one oxidized isolation region. The top surfaces of the epitaxial layer and the oxidized isolation regions are substantially coplanar, thereby reducing undesirable elevation variances or "steps" between the isolation oxide and other portions of the wafer surface.

To form isolated pockets of epitaxial silicon, grooves (sometimes called depressions) are formed in the silicon where isolation regions are to be formed. During groove formation, the remainder of the silicon surface where grooves are not desired is protected by an insulation layer which is substantially unaffected by the silicon etch used to form the grooves. The grooves are etched in a conventional way to a depth of about 50 percent of the desired depth of the oxidized isolation regions. The epitaxial silicon exposed by the grooves is oxidized down to the underlying isolation PN junction. When the isolation PN junction lies in the substrate, the oxidation process continues into the substrate so that the oxidized isolation regions penetrate into the substrate to intersect the appropriate portions of the isolation PN junction. Silicon nitride is a convenient insulation to protect underlying silicon from oxidation.

Several different combinations of epitaxial layers and substrates are possible. If the substrate is of one type conductivity (either P-type or N-type), then an epitaxial layer of opposite type conductivity can be grown directly upon the substrate. In addition, buried layers of opposite type conductivity can be formed in the top surface of the substrate and then an epitaxial layer of either type conductivity can be formed on the substrate over the buried layers. In each of these situations, however, the oxidized isolation regions must extend down to the isolation PN junction.

In one embodiment of this invention, only three diffusion masking steps are required, one to form the buried layer, one to form the oxidized isolation regions and the third to form the emitter regions and the collector sinks in the resulting device. The base mask is eliminated and an unmasked, "sheet" diffusion is used. The contact mask alignment is simplified relative to prior art processes because the electrical contacts can be formed abutting portions of the oxide isolation region without danger of short circuits.

The above-described invention overcomes a substantial number of disadvantages of prior art integrated circuit structures and provides a simplified, improved, and more reliable technique for their manufacture.

The electrically isolated transistors in integrated circuits fabricated according to this invention are more than 65 percent smaller than comparable transistors isolated using prior art diffusion isolation techniques. Contrary to normal expectations, despite this size reduction, yields are significantly improved.

A major portion of the silicon surface area of a representative integrated circuit made according to this invention is not occupied by the circuit elements themselves, but is occupied by the oxidized isolation regions. Any defect in the masks used to make the circuit will, therefore, have a very high probability of overlying these isolation regions and not the circuit elements. A mask defect which falls over such an isolation region has absolutely no detrimental effect on the operation of the circuit and is thus rendered harmless. Since mask defects are a major source of integrated circuit yield loss, this neutralization of mask defects in the invented process enormously increases integrated circuit yields.

Finally, the use of the oxidized isolation regions of this invention decreases unwanted capacitances between adjacent semiconductor pockets and increases the allowable tolerances with which masks must be aligned. Indeed, in some cases, an entire masking step can be eliminated.

DETAILED DESCRIPTION

Figures 1, 2, 3A, 3B:
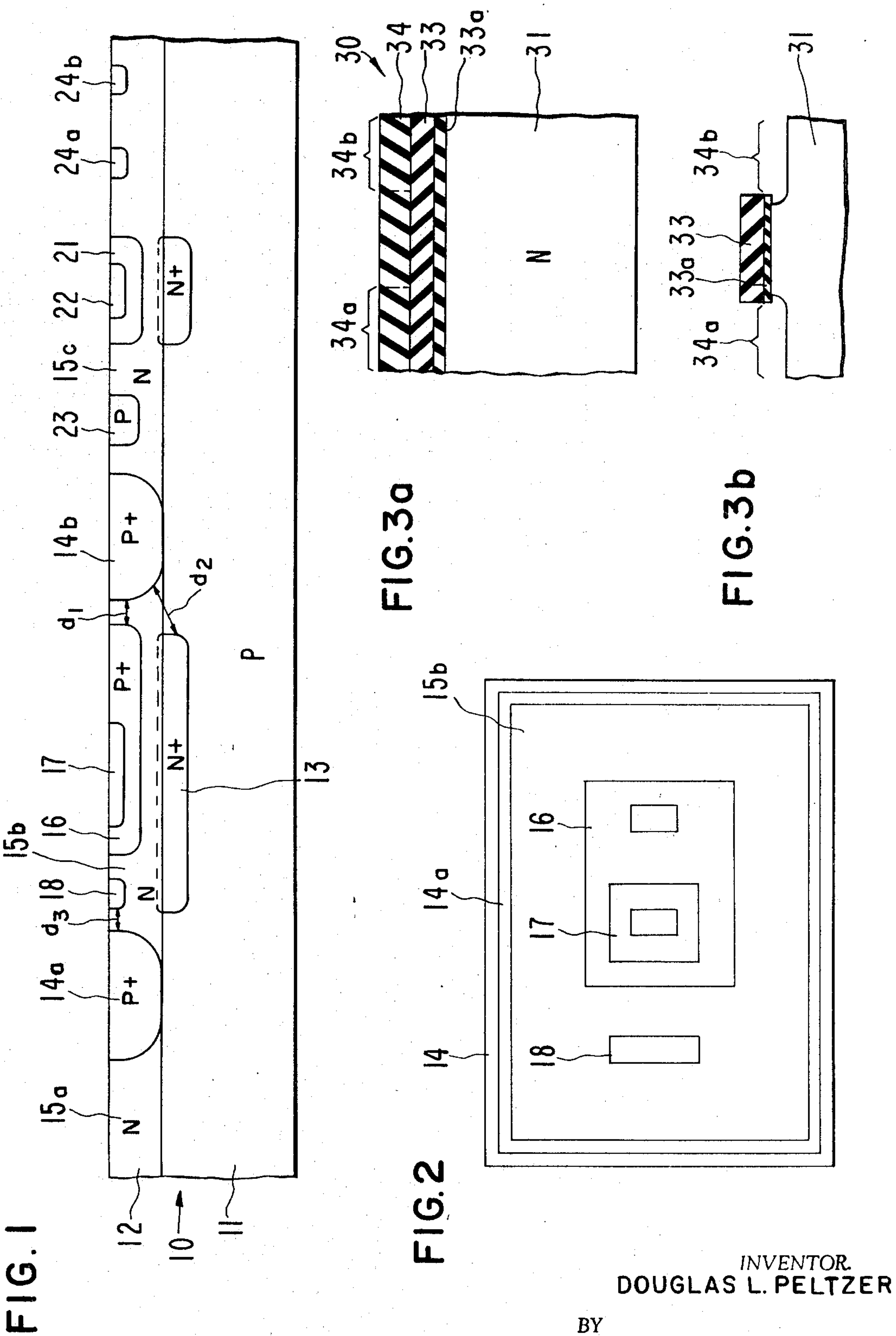
FIG. 1 shows in cross section a typical diffusion isolated integrated circuit of the prior art.
FIG. 2 shows a top view of a portion of the circuit shown in FIG. 1.
FIGS. 3*a* through 3d illustrate the selective oxidation process disclosed by Appels et al. in the article referred to above.

An integrated circuit structure of the prior art is shown in FIGS. 1 and 2. For clarity, oxide layers, contact windows through the oxide and lead interconnects are not shown. Wafer 10 comprises a P-type substrate 11 of semiconductor material on which is formed epitaxial layer 12 of N-type semiconductor material. A buried collector layer 13 has been formed in substrate 11 at the interface of substrate 11 and epitaxial layer 12. Isolation grid 14 of P+ type material is shown intersecting the cross section of the device in two areas, areas 14*a* and 14*b*. Each pocket 15*a*, 15*b* and 15*c* of semiconductor material is of a conductivity type opposite to that of the isolation region 14 and substrate. Each pocket is electrically isolated from adjacent pockets of semiconductor material by an isolation PN junction formed around the pocket.

Pocket 15*b* has formed in it a heavily doped P+ type base region 16. Base region 16 in turn has formed in it N-type emitter region 17. Contact to the portion of pocket 15*b* of N-type epitaxial material underlying base region 16 is made through an N+ type collector sink region 18. Buried layer 13 insures that most portions of the collector region 15*b* can be contacted through a low resistance path, as is well known in the art, as disclosed by U.S. Pat. No. 3,260,902 to Porter.

It should be noted in FIG. 1 that the base region 16 is separated from the diffused isolation region 14 by at least the distance $d_1$, determined by masking tolerances and depletion layer thicknesses. In addition, it is desirable to separate buried N+ region 13 from the diffused isolation region 14 by a reasonable distance $d_2$. In certain instances region 13 is allowed to contact the isolation region 14 with, however, a resulting degradation in breakdown voltage and a significant increase in capacitance. Such devices thus are not suitable for high-frequency operation. In addition, it is desirable to maintain the distance $d_3$, between collector sink 18 and isolation region 14. If desired, collector sink 18 can be brought into contact with isolation region 14. However, in such cases the breakdown voltage between the two regions is significantly lower and the capacitance is significantly higher than they are if the distance $d_3$ exists between these two regions.

In addition to the prior art structure shown in FIG. 1, B. T. Murphy et al., in a paper entitled "Collector Diffusion Isolated Integrated Circuits" published in Vol. 57, Proceedings of the IEEE, No. 9, pages 1523–1527 (Sept. 1969) disclose a transistor in which the base region is formed abutting collector sinks contacting an underlying buried collector region. Even with this structure, however, the base region must not contact the P-type region which separates the collector sinks of adjacent transistors.

In addition, it is desirable to maintain some clearance between collector sink region 18 and P+ type base region 16 to insure that the collector-base junction has a high breakdown voltage and low capacitance. If one accepts the lower breakdown voltage and higher capacitance associated with having the collector sink region 18 in intimate contact with base region 16, the clearance required between collector sink region 18 and base region 16 can be reduced or completely eliminated. However, the usual clearance kept between these two regions further increases the size of the device built using these prior art techniques. To achieve the desired separation between the sink region 18 and the base region 16, as well as between the base region 16 and the diffused isolation region 14, very stringent masking tolerances must be maintained. Not only does the mask have to be precisely cut to the exact dimension of the collector sink region 18, but the mask must be accurately registered on the device.

P-type resistor region 23 in pocket 15*c* of N-type epitaxial semiconductor material comprises either a base resistor or the emitter of a PNP transistor which has substrate 11 as its collector. A portion of pocket 15*c* may be a base region of this transistor, contact to which is made in a standard manner. Region 22, nested in P-type region 21, forms an emitter-base diode with region 21.

Contacts 24a and 24b and the intermediate epitaxial material form an epitaxial resistor. The dimensions of this epitaxial resistor are defined by isolation regions (not shown) similar to region 14 and by the spacing between contacts 24a and 24b.

A typical prior art processing sequence for forming isolated pockets of semiconductor material containing NPN transistors is as follows:

1. Oxidize P-type substrate;
2. Mask and diffuse N+ buried collector;
3. Strip oxide and grow N-type epitaxial silicon layer;
4. Oxidize surface of epitaxial layer;
5. Mask, diffuse and oxidize isolation regions;
6. Mask, diffuse and oxidize base regions;
7. Mask, diffuse and oxidize emitter and collector sink regions;
8. Mask areas for metal-silicon contacts;
9. Deposit and mask metal interconnections.

The above process has six masking steps. Each masking step except the last involves the opening of windows in the layer of oxide covering the wafer being processed. The remaining oxide serves as a barrier to the diffusion of dopant atoms into the semiconductor wafer.

FIG. 2 shows in top view the relationship of collector sink 18 to the emitter region 17 and the base region 16 shown in cross-sectional view in FIG. 1 as formed in semiconductor pocket 15b. The closed shape of diffused isolation region 14 surrounding pocket 15b is shown in FIG. 2.

Base region 16 is necessarily separated from isolation region 14. This separation is necessary for electrical isolation of these two regions.

FIGS. 3a through 3d show the technique used by Appels et al. in the above-cited reference to form a discrete transistor. Over an N-type substrate 31 (FIG. 3a) is deposited silicon-nitride layer 33. In some cases, Appels et al. use a thin layer 33a of an oxide of the semiconductor material deposited between substrate 31 and silicon nitride layer 33. A layer 34 of an oxide of the semiconductor material is deposited on nitride layer 33.

Next, windows are formed in oxide layer 34 in the locations shown by the dashed lines 34a and 34b (FIG. 3a). The nitride exposed through these windows is etched away. The etchant used for silicon nitride (typically phosphoric acid) has little effect on the oxide layers. When the nitride beneath the windows has been removed, a new etchant (such as buffered HF) which removes the oxide is used. This etchant has little effect on nitride and thus the remaining portions of nitride layer 33 (FIG. 3b) mask the underlying oxide 33a, if any, and the silicon. The portions 35a and 35b of substrate 31 exposed by windows 34a and 34b through oxide layer 33a (if any) and nitride layer 33, are etched away to a selected depth to form shallow grooves.

Figure 3C:
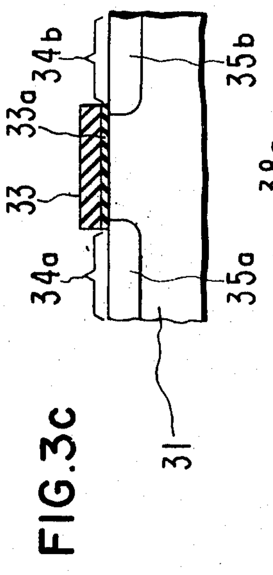

The wafer is then thermally oxidized (FIG. 3c). No oxide will grow on the surface of substrate 31 beneath the remaining nitride 33. However, in those portions 35a and 35b of wafer 30 where nitride has been removed oxide will grow in the semiconductor material. This local oxidation of silicon, called LOCOS by Appels et al., fills the grooves 35a and 35b with an oxide of the semiconductor material.

Studies cited by Appels et al. show that the silicon oxidizes at a much faster rate than does the silicon nitride. Thus, the structure shown in FIG. 3c, with grooves 35a and 35b filled with silicon oxide, is obtained by placing wafer 30 in an oxidizing environment. The oxidized top portion of nitride layer 33 has been removed from the wafer shown in FIG. 3c.

Figure 3D:
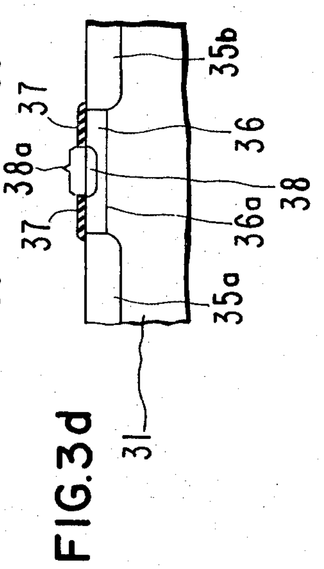

After oxidized regions 35a and 35b have been formed, nitride 33 is removed by a nitride etch, as shown in FIG. 3d. Then, oxide 33a (if any) is stripped from substrate 31, and a P-type impurity is diffused into region 36 of substrate 31. Oxide regions 35a and 35b mask the P-type impurity and thus restrict the lateral extent of PN-junction 36a to that region of substrate 31 between oxidized regions 35a and 35b.

Oxide layer 37 (FIG. 3d) is then reformed on the surface of substrate 31 and a window 38a is formed in this oxide layer.

Then an N-type impurity is diffused through this window to form an N-type emitter region 38 in P-type base region 36. Thus Appels et al. essentially disclose a technique of obtaining a flat base-collector junction. Because this junction is flat, its breakdown voltage is higher than the breakdown voltage commonly associated with a typical dish-shaped base-collector junction. The emitter-base junction, however, is dish-shaped as shown.

Figure 4:
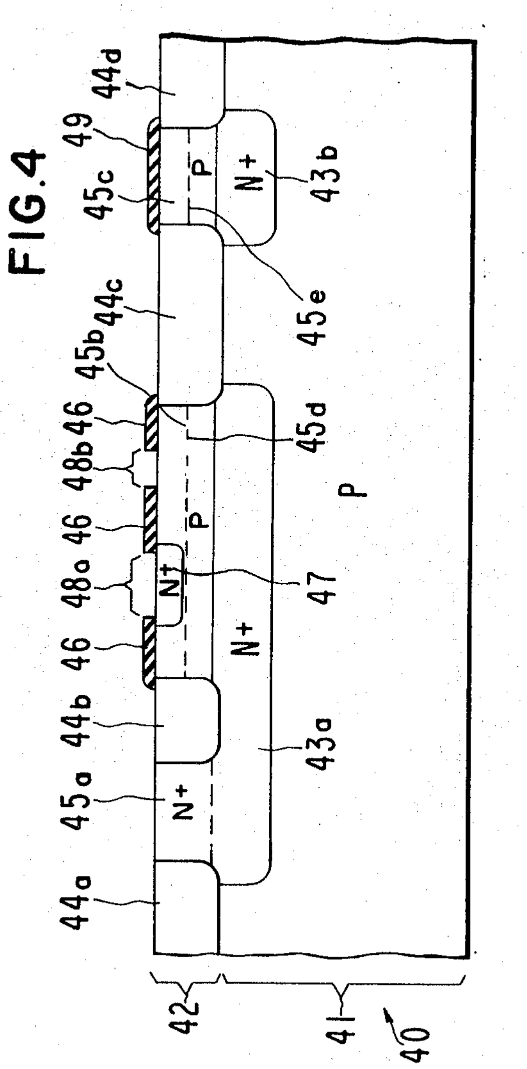
FIG. 4 shows an isolated NPN transistor and other devices produced using the selective oxidation isolation technique of this invention.

FIG. 4 shows the structure of this invention wherein oxide isolation techniques are novelly applied to a silicon epitaxial structure having a PN isolation junction to subdivide the epitaxial silicon layer into fully isolated pockets. In this specification when a pocket of semiconductor material is described as isolated by an annular-shaped isolation region of oxidized semiconductor material, it shall be understood that in the simplest case a PN isolation junction underlies the pocket of semiconductor material and intersects the isolation region of oxidized semiconductor material so that the line of intersection forms a closed path. This definition also covers the structure which results when a buried collector layer extends in the substrate from one pocket to another pocket so as intentionally to connect regions in pockets which would otherwise be electrically isolated. In this case the term "isolated pocket of semiconductor material" shall be defined to include all pockets of semiconductor material electrically connected by the buried layer. In this case from one to many closed paths of intersection between the oxidized semiconductor material and PN isolation junctions may occur in isolating the interconnected semiconductor material from other pockets of semiconductor material. The term "annular" will be used to mean any closed path of any shape, whether uniform or nonuniform in width. Thus the term"annular-shaped isolation region" is used in this specification to include all possible shapes of oxidized isolation regions which completely define the lateral limits of one pocket of semiconductor material.

The process of this invention yields a structure in which a significant portion of the epitaxial silicon layer is oxidized through to a PN isolation junction. Each annular-shaped isolation region includes all the oxidized silicon adjacent to a pocket of isolated epitaxial silicon. A given region of oxidized silicon can serve as part of the annular-shaped oxidized isolation region of more than one isolated pocket of silicon.

Wafer 40 comprises a P-type silicon substrate 41 in which are diffused N+ regions 43a and 43b. Region 43a serves as a buried collector, and a crossunder beneath the oxidized isolation region 44b of this invention. Formed on the top surface of substrate 41 in P-type silicon epitaxial layer 42. Formed in grooves etched in epitaxial layer 42 are oxide isolation regions 44a, 44b, 44c, and 44d. These oxidized isolation regions are formed by first covering the surface of epitaxial layer 42 with a nitride layer, typically silicon nitride, and then removing the nitride over those portions of epitaxial layer 42 in which the grooves are to be formed. When oxidized, the grooves defined the isolation regions.

While one embodiment of this invention uses a silicon nitride layer to mask those portions of the epitaxil semiconductor material in which grooves are not to be formed, any insulation layer which masks against thermal oxidization of the underlying semiconductor material and which has an etch rate significantly slower than that of the oxide of the semiconductor material can be used in place of silicon nitride.

Epitaxial layer 42 is a true thin film, being less than 5 microns thick and typically about 1.25 microns thick. Practical limitations on the thicknesses of adherent oxide limit the thickness of the oxide formed from the silicon to less than 3 microns. Thicker oxidizes tend to crack. A practical limit on the thinness of epitaxial silicon layer 42 is the minimum thickness below which transistor action is no longer obtained. When 1.25 microns thick, the grooves are etched approximately 7,000 angstroms into epitaxial layer 42. Then the etched grooves are oxidized. The resulting silicon oxide extends both above and below the initial exposed surface of each groove. For a 1.25-micron epitaxial layer, normally about 1.2 microns of oxide is grown. Oxide extends about 1,500 angstroms past the underlying PN isolation junction. When epitaxial silicon layer 42 is another thickness, the groove depth is appropriately selected so that the oxide extends past the PN isolation junction, contrary to the teachings of the prior art.

Next, nitride is removed from epitaxial layer 42. (in some variations of the process of this invention, a P-type base contact diffusion through window **48*b* to a depth shown by line 45*d*, is incorporated into the process at this point.) Then, the surface of epitaxial silicon layer 42 is oxidized. Oxide is removed from over region 45*a*. N-type impurities are then diffused into region 45*a* to form a collector sink which extends to buried collector layer 43*a*. The lateral extent of sink 45*a* is defined by an annular oxidized region of which sections 44*a* and 44*b* are shown in cross section in FIG. 4. In some circumstances the sequence is reversed to allow the diffusion of the collector sink region 45*a*** before the base-contact diffusion.

N-type impurities are next diffused into region **45*b* of P-type epitaxial layer 42 through window 48*a* in oxide 46 to form emitter region 47. Thus buried collector 43*a*, epitaxial base 45*b* and diffused emitter 47 form an NPN transistor. The base 45*b* of this transistor is completely isolated from adjacent regions of epitaxial layer 42 by an annular oxidized isolation region shown in section as 44*b* and 44*c*, exending to or beneath the PN isolation junction. Regions 45*a* and 45*b* together with buried layer 43*a* form one isolated pocket isolated by annular-shaped oxidized isolation regions of which sections 44*a* and 44*c* are shown, and a PN isolation junction comprising the PN junction between buried layer 43*a* and substrate 41. Window 48*b*, cut through oxide 46, allows contact to be made to epitaxial base 45*b***.

In section **45*c* of epitaxial layer 42 is shown a resistor. This resistor can be either a base resistor or an epitaxial resistor depending on whether an added base layer diffusion (as indicated by line 45*e*) is employed in this area or not. This resistor is covered by oxide layer 49 through which windows can be cut for contact to the resistor. Material 45*c* is electrically isolated from substrate 41 by N+ region 43*b* and isolated laterally by an annular oxidized isolation region (sections 44*c* and 44*d***).

Region **45*c* may be connected through the PN diode formed by region 45*c* and buried layer 43*b* to another buried layer in the same substrate 41 by a crossunder, such as crossunder 43*a*, which extends beneath an oxidized isolation region 44*b*, and 44*c***.

A lead interconnection pattern is then formed on the surface of the wafer to interconnect selected active and passive components into the desired circuit. The leads are typically metal such as aluminum, although conductive semiconductor material or other conductive material can also be used.

Thus, to make the structure shown in FIG. 4, a typical processing sequence is summarized as follows:

1. Oxidize P substrate.
2. Mask and diffuse N-type regions which serve as buried collectors, crossunders and isolation regions (FIG. **10*a*, regions 43*a*, 43*b***).
3. Strip oxide and grow a thin P-type epitaxial silicon layer (FIG. **10*b*, layer 42**).
4. Deposit and mask a silicon nitride layer (FIG. **10*b*, layers 141*a*, 141*b*, 141*c***).
5. Etch and oxidize isolation regions (FIG. **10*c*, regions 44*a*, 44*b*, 44*c*, 44*d***).
6. Remove nitride, either partially or completely according to the following rules:
   a. When no base contact predeposition is made, and when no epitaxial resistors are to be formed in the epitaxial material, completely remove the nitride without a masking step (FIG. **10*c*, layer 141*b***).
   b. Where epitaxial resistors, channel regions for MOS devices, or high $h_{fe}$ transistors are to be made, leave the nitride as mask against diffusion, (FIG. **10*c*, layers 141*a*, 141*c***), remove nitride from other regions.
7. Perform base contact predeposition and diffusion if desired (FIG. **10*c*, region 142**).
8. Remove the remaining nitride, if any, and oxidize the wafer (FIG. **10*d*, layers 143, 46, 49**).
9. Mask (FIG. **10*d*, remove layer 143) diffuse collector sinks (FIG. 10*d*, region 45*a*) and reoxidize, if desired (FIG. 10*d*, replace layer 143**).
10. Mask (FIG. **10*d*, cut window 48*a* in oxide layer 46) and diffuse the emitters (FIG. 10*d*, region 47**).
11. Mask contact cuts (FIG. **10*e*, contact windows 48*a*, 48*b*, and removal of layer 143**).
12. Deposit metal interconnect layer, mask interconnect pattern (FIG. **10*e*, metal 144*a*, 144*b* and 144*c***) and alloy. A total of six or seven masking steps are required.

In the two cases where there is no masking step associated with the removal of nitride under step **6*a***, the process of this invention eliminates one masking step compared to those common processes which include a separate collector sink mask and diffusion.

As indicated in FIG. 4 this process provides:

1. NPN transistors (regions **43*a*, 45*b*, 47**)
2. Diodes (regions **45*b*, 47 and 43*a*, 45*b***)
3. Epitaxial resistors (  5kΩ/square) (region **45*c***)
4. Base resistors (  600Ω/square) (region **45*b* and 45*c*** with base contact predeposition
5. Buried collector crossunders under isolation (region **43*a***).

Figure 10A:
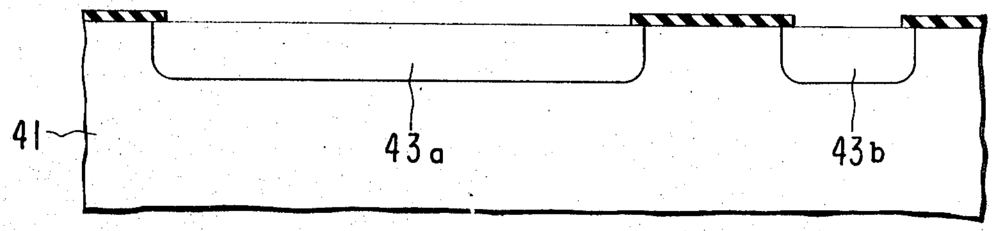
FIGS. 10*a* through 10*e* illustrate the process of this invention.
Figure 10B:
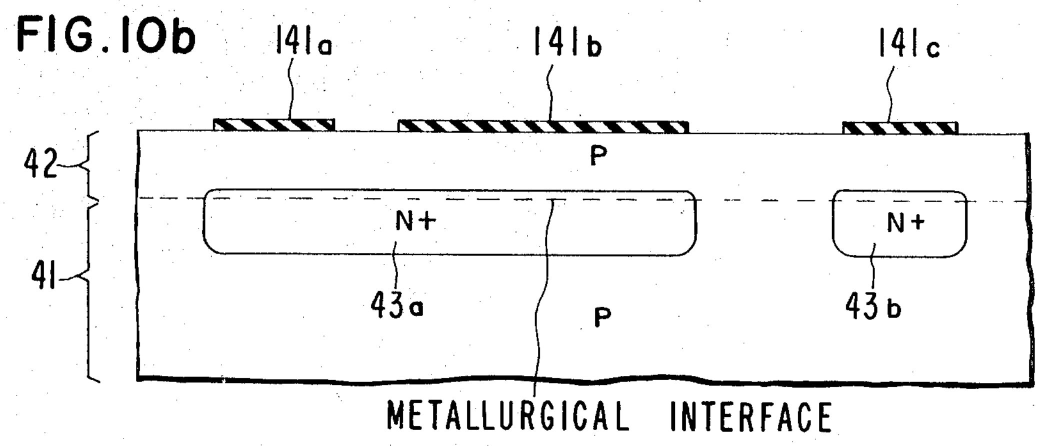
Figure 10C:
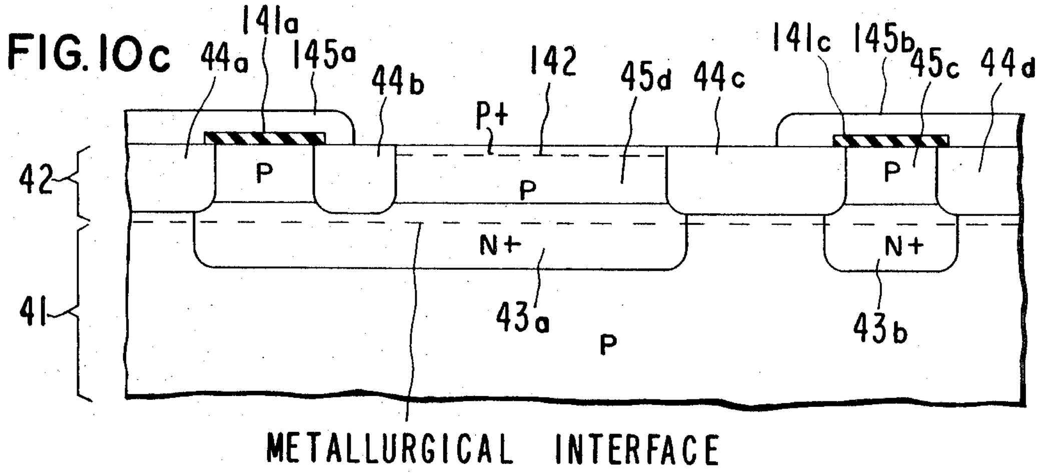

Step 6 above, the base mask step, demonstrates the advantage of oxide isolation of the invention. Masking the base involves the removal of nitride. The nitride may be removed with very little etching of the oxide isolation so that an oversize base mask (see photoresist **145*a* and 145*b* in FIG. 10*c*) may be used. The actual dimensions of the base region are then defined by the isolation regions 44*b*, and 44*c***. This mask may be eliminated entirely if a sheet base diffusion is used.

Figure 10D:
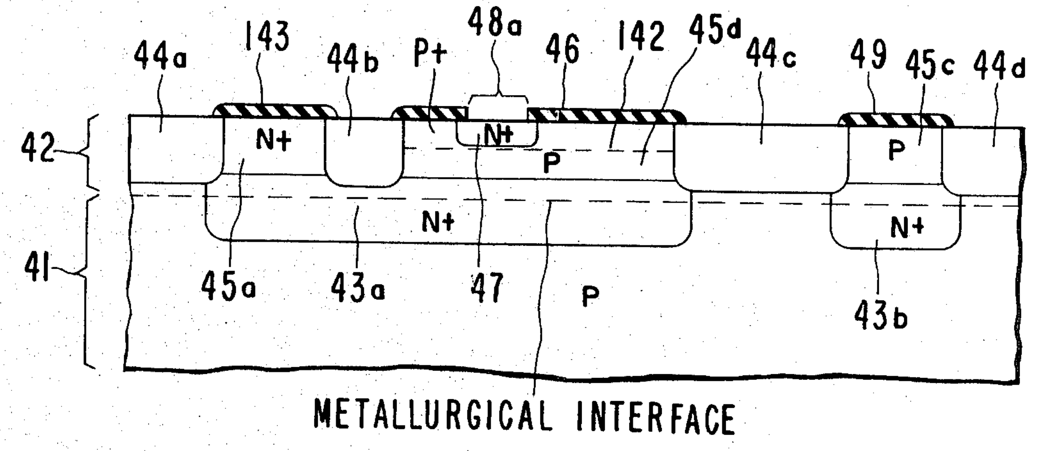
Figure 10E:
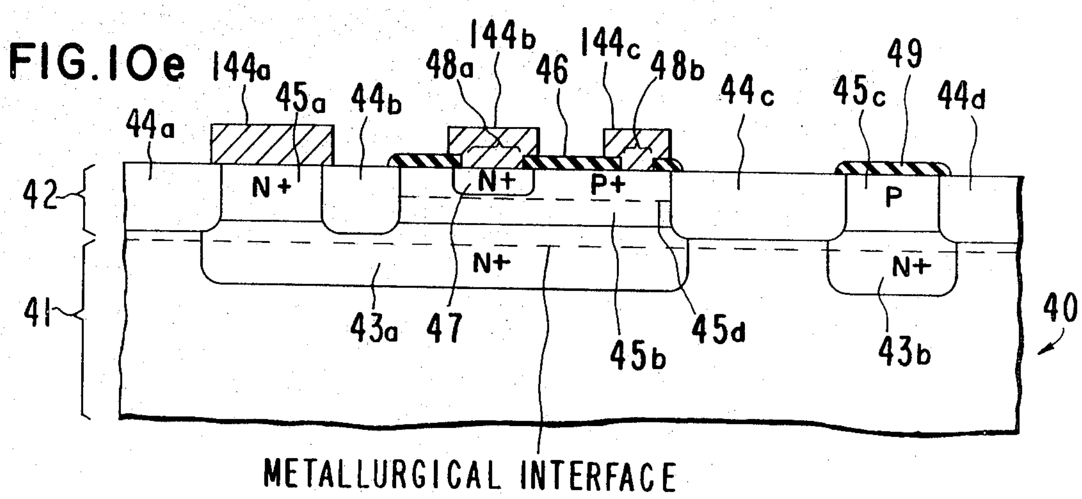

Similarly, regions covered with a thin oxide, such as collector sink region **45*a*, FIG. 10*d*, can be etched through an oversized mask without a detrimental effect on the adjacent oxide isolation. The collector sink 45*a* contacts the buried collector 43*a* beneath the P-type epitaxial silicon layer. A separate masking step is used to expose the surface of the collector sink 45*a*. The boundaries of the sink are defined by the oxide isolation 44*a*, 44*b* so that the sink is prealigned to the base 45*b*, the oxidized isolation region 44*a*, 44*b*, and the buried collector 43*a*. Collector sink 45*a* can be formed either before or after base region 45*b*** is formed.

Step 8 above, removal of nitride and oxidation, places an oxide protective covering over areas which should not receive sink or emitter diffusions. Buried collector resistors are formed in the normal fashion. Base resistors and epitaxial resistors can be defined by the boundaries of the oxide isolation and the Ω/square is controlled by controlling the dopant concentration and the depth of the base diffusion and the epi resistivity.

The emitter regions, contacts, metallization and metal delineation are completed in the usual manner.

Unexpected advantages over the prior art accrue from the process and structure of this invention. First, the oxidized isolation regions define the lateral extents of the collector sinks, transistor base regions, and epitaxial and base resistors, thereby in some cases reducing the total number of masking steps required to produce an integrated circuit.

Second, the intimate contact of the base, resistor, and the collector sink regions to the oxidized silicon results in a much higher packing density. With prior art diffused isolation techniques, this was not possible because the isolation regions were conductive and undesired short circuits would then exist between the base and resistor regions on the one hand, and the conductive isolation region on the other hand. Since this invention uses insulating oxide for part of the isolation, the base can extend to the isolation region with no danger of breakdown or a short circuit between the base region and the isolation region. Likewise for the same reasons, the emitter can also be formed directly abutting the oxide isolation.

Third, use of thinner epitaxial layers than common in the prior art reduces consumption of surface area by lateral movement of the isolation during its formation. The oxidation of the semiconductor layer is essentially completed when the oxidation reaches the PN isolation junction. Packing densities can be higher with thin epitaxial layers than with thick epitaxial layers because less surface area is consumed by lateral expansion of the isolation. This lateral expansion is about twice the depth of the isolation which in turn is about equal to the thickness of the epitaxial silicon layer.

Fourth, the invented structure reduces the capacitance and increases the breakdown voltage to sidewall i.e., the vertical pocket wall).

Fifth, another advantage is that defects in masks and masking processes, such as tears and pinholes, have less effect on the resulting circuit. For example, defects in the isolation mask in the prior art result in the formation of undesired diffused isolation areas where the pinholes or other defects are located. In this invention, however, these defects merely result in the formation of additional oxide. Defects in other masks have a high probability of falling over oxidized isolation regions of semiconductor material where they have no significant detrimental effect on the resulting circuit. For example, defects in the base diffusion mask which connect the base to the isolation regions have no effect on the performance of the circuit. Similarly, defects in contact masks have little or no effect because a spurious partial penetration of metal into oxidized isolation region of the device has no effect on device performance. A defect in an emitter mask, which in prior art devices can short an emitter region to a collector region, has no effect on the device of this invention. Finally, defects connecting the emitter region to an isolation region have little or no effect on the performance of the invented device.

Figure 5:
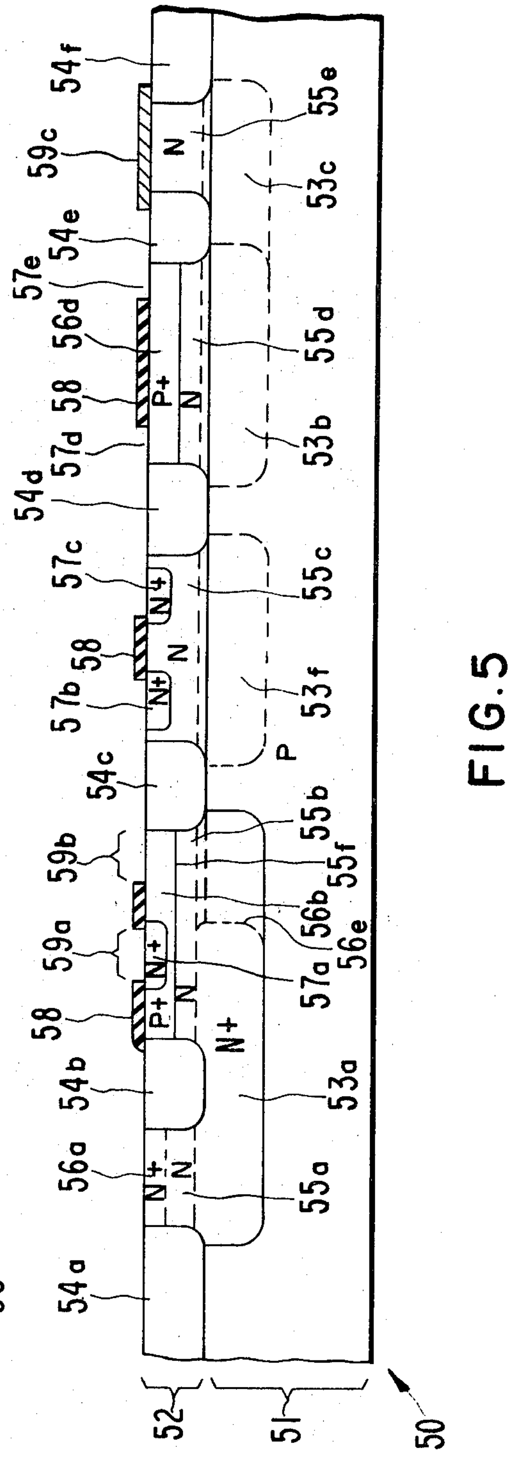
FIG. 5 shows an integrated circuit containing an isolated double-diffused transistor, and isolated epitaxial resistor, an isolated base resistor, and an isolated Shottkey barrier diode formed on a wafer selectively oxidized according to the techniques of this invention.

FIG. 5 shows the oxidized isolation technique of this invention used to form an integrated circuit containing double-diffused transistors. Wafer 50 comprises P-type substrate 51 having a surface N-type silicon epitaxial layer 52. Formed in the top surface of substrate 51 adjacent the interface of this substrate with epitaxial layer 52 is N+ buried collector region **53*a*. Contained in epitaxial layer 52 are oxidized regions shown by cross sections 54*a*, 54*b*, 54*c*, 54*d*, 54*e*, and 54*f*. The top surfaces of oxidized regions 54 are approximately in the same plane as the top surface of epitaxial layer 52. N+ type collector sink 56*a* formed in epitaxial layer 52 contacts N+ buried collector layer 53*a* through N-type epitaxial material 55*a*. Sink 56*a* can be formed simultaneously with emitter region 59*a*. Collector sink 56*a* is separated from adjacent regions of epitaxial layer 52 by an annular isolation region of oxidized silicon of which cross sections 54*a* and 54*b* are shown N+ buried collector layer 53*a* crosses under a portion of oxidized region 54*b* and contacts N-type epitaxial material 55*b*. Region 55*b* serves as the collector of a transistor. Just above region 55*b* and separated therefrom by a substantially plane PN-junction 55*f* is P+ type base region 56*b*, formed by a standard diffusion process. During the base diffusion the oxidized annular region including sections 54*b* and 54*c*** defines the lateral extent of the base.

Annular isolation regions 54 allow masks to be placed on the wafer with less accuracy than would otherwise be the case. This is so since even though some of the remaining portions of epitaxial material 52 must be masked to prevent impurity diffusion, oxidized regions 54 limit the lateral extent of the base diffusion. Thus the tolerances on the masking to form base **56*b* are relaxed compared to prior art techniques and yet base region 56*b*** is formed very accurately.

After the base region **56*b* is formed, oxide 58 is formed over the surfaces of epitaxial semiconductor material 52 and a window 59*a* is cut through this oxide 58. An N-type dopant is diffused through window 59*a* to form emitter region 57*a* of the transistor. Thus, between oxidized regions 54*b* and 54*c* is formed an NPN double-diffused, oxide-isolated transistor. Base contact to this transistor, made through window 59*b* in oxide 58, can be permitted to overlap the adjacent oxidized isolation region 54*c***.

In region **55*c* of epitaxial layer 52 is formed an epitaxial resistor. Contact to this resistor is made through highly doped N-type regions 57*b* and 57*c* formed in openings in oxide 58. Resistor 55*c* is isolated from adjacent regions of the integrated circuit by an annular oxidized region 54*c*, 54*d*. Alternatively, this resistor can be contacted by one or more highly conductive crossunders similar to N+ region 53*a***.

A base resistor is formed in region **55*d* of epitaxial layer 52. A P-type impurity is diffused into N-type epitaxial region 55*d* to form P-type region 56*d*. Contact to this base resistor is made through windows 57*d* and 557*e* opened on both sides of oxide 58 above P-type semiconductor material 56*d*. This resistor is called a base resistor in view of the fact that the conductivity type and dopant level of the resistor are substantially the same as those of the base region 56*b* of the NPN transistor formed in section 55*b* of epitaxial layer 52. Sections 54*d* and 54*e* are part of an annular oxidized isolation region surrounding layers 55*d* and 56*d* to isolate these layers from the remainder of epitaxial layer 52. An N+ buried layer 53*b*, shown in dashed lines may, if desired, be placed beneath material 55*d* and in contact with the surrounding oxidized isolation region 54*d*, 54*e* to increase the breakdown voltage of this resistor to substrate 51**.

Shown attached to the top surface of region **55*e* of epitaxial material is metal layer 59*c*. Layer 59*c* forms a Schottky-barrier diode with the underlying epitaxial material. This diode is isolated from adjacent regions of epitaxial layer 52 by annular region 54*e*, 54*f* surrounding N-type epitaxial material 55*e*. An N+ buried layer 53*c*** (shown in dashed lines) may also be placed under this diode to increase the device breakdown voltage and decrease series resistance.

The N-type epitaxial layer can be used to form N-type epitaxial resistors as shown by region **55*c*** in FIG. 5. These resistors can be used as collector resistors without a special metal connection from resistor to collector.

Figures 6, 7A, 7B, 8, 9:
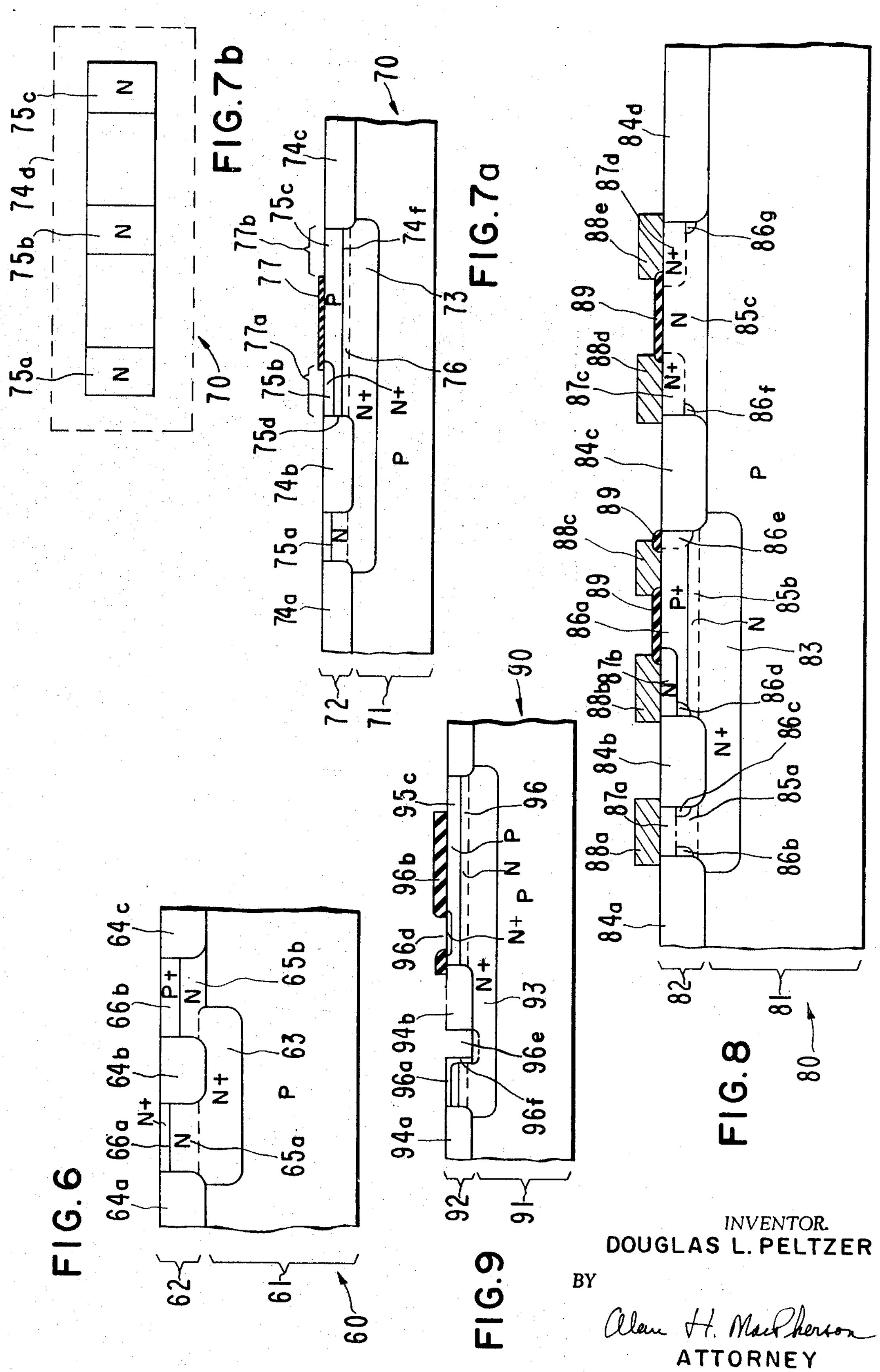
FIG. 6 shows an isolated PNP transistor formed using the selective oxidation techniques of this invention.
FIGS. 7*a* and 7*b* show a walled-emitter NPN transistor formed using the selective oxidation techniques of this invention.
FIG. 8 shows a walled-emitter NPN transistor and other devices formed using the selective oxidation techniques of this invention.
FIG. 9 shows a unique collector sink structure made possible by the structure of this invention.

FIG. 6 shows a PNP transistor formed using the oxide isolation technique of this invention. Wafer 60 comprises a P-type silicon substrate 61 which serves as the collector of the PNP transistor. Formed in P-type substrate 61 is N+ buried layer 63. Layer 63 extends beneath oxidized isolation region **64*b* formed in N-type epitaxial silicon layer 62. Epitaxial layer 62 overlies the top surface of substrate 61. —N-region 63 connects N+ epitaxial material 65*a*, surrounded by annular shaped oxidized isolation region 64*a*, 64*b* with N-type epitaxial region 65*b* surrounded by annular-shaped oxidized isolation region 64*b*, 64*c*. N-type base region 65*b* is contacted through region 66*a* of N+ type material, N epitaxial region 65*a* and N+ buried layer 63. A P-type impurity is diffused into region 66*b* to form the emitter of the PNP transistor. The emitter-base junction between regions 66*b* and 65*b* is substantially flat. Because the emitter region 66*b* occupies the complete surface area surrounded by one annular oxidized isolation region 64*b*, 64*c***, the masking tolerances on the formation of the emitter region are less critical than with prior art devices of the same size.

In the structure of FIGS. 5 and 6, it should be noted that epitaxial layers 52 and 62 are N-type rather than P-type This means no buried layer is necessary under resistors and the collector sink diffusion can be replaced by a shallower emitter diffusion and masked by the emitter-masking step. The base is formed by the base diffusion and the epitaxial layer now acts as the collector of the NPN transistor (FIG. 5).

The N-type epitaxial layer is also useful for fabrication of substrate PNP transistors in which the P-type base of an NPN transistor forms the emitter of a PNP transistor. The N-type epitaxial layer forms the PNP base and the P-type substrate acts as the collector of the PNP transistor. With this arrangement, the transistor shown in FIG. 5 has buried layer **53*a* reduced to a size such as shown by dashed line 56*e***. This device is called a substrate controlled switching transistor or SCST.

FIGS. 7*a* and 7*b* show a structure in which the layout of the collector, the emitter and the base has been changed, thus affecting the emitter-isolation spacing. The processes used above to fabricate the structure shown in either FIG. 4 or in FIGS. 5 and 6 can be used. The structure shown in FIGS. 7*a* and 7*b* is called the walled-emitter transistor because the emitter is allowed to contact the oxide isolation. As shown in FIG. 7*a* wafer 70 comprises a P-type silicon substrate 71 in which is diffused an N+ buried collector layer 73. N-type epitaxial layer 72 is grown on the top surface of substrate 71 (this layer could also be P-type). Oxidized isolation regions 74*a*, 74*b* and 74*c* are formed in epitaxial layer 72 using the techniques described above. A collector contact region 75*a* is formed in epitaxial layer 72 and is surrounded by an annular oxidized isolation region 74*a*, 74*b*. In region 76 of epitaxial layer 72, an impurity is diffused to form a P+ type base region 75*c*. The PN junction 74*f* between P+ base region 75*c* and the epitaxial region 76 is approximately flat and extends to an annular-isolation region, 74*b*, 74*c*. Next, an oxide layer 77 is formed on the top surface of epitaxial layer 72 and a window 77*a* is formed in this oxide layer. Through window 77*a* an N-type impurity is diffused to form emitter region 75*b*. Contact to base region 75*c* is made through window 77*b* in oxide 77. Emitter region 75*b* abuts against a part of oxidized isolation region 74*b*. The top view of the circuit shown in FIG. 7*b* illustrates the positions of the collector, base and emitter contacts and the oxidized isolation regions. The collector, base and emitter contacts each can extend over the adjacent oxidized isolation regions thereby significantly decreasing the difficulty of aligning the contact mask.

In forming the transistor shown in FIG. 7*a*, care must be taken that the impurity concentration in region 75*d* of base region 75*c* is sufficiently high to prevent unwanted inversion, depletion, or channel formation, particularly adjacent oxide region 74*b*.

FIG. 8 shows another walled-emitter NPN transistor constructed using the oxidized isolation regions of this invention. Wafer 80 comprises P-type silicon substrate 81 on which is formed N-type silicon epitaxial layer 82. Formed in substrate 81 is N+ type buried collector region 83. Oxidized isolation regions 84*a* through 84*d* extend to or through the isolation PN junction. Collector contact to collector region 85*b* is made through collector contact 88*a* attached to collector sink 87*a* formed in portion 85*a* of epitaxial layer 82. Base region 86*a* is diffused into underlying N-type epitaxial region 85*b* of epitaxial layer 82. The PN junction between the base region 86*a* and collector region 85*b* is approximately flat. Emitter region 87*b* is formed in one side of base region 86*a* adjacent the annular-shaped oxidized isolation region 84*b*, 84*c*. Contacts to the emitter region 87*b* and the base region 86*a* are made through contacts 88*b* and 88*c* overlying windows in oxide layer 89. In this case both the emitter diffusion mask and the emitter contact metal mask, if used, can overly the adjacent isolation oxide, greatly relaxing masking tolerances. An N-type epitaxial resistor is formed in semiconductor region 85*c* of epitaxial layer 82, surrounded by annular-shaped oxidized isolation region 84*c*, 84*d*. Contact to this epitaxial resistor is made through metal layers 88*d* and 88*e* contacting regions of epitaxial material 85*c* through windows in oxide 89.

Surrounding base region 86*a*, collector sink 87*a*, and epitaxial resistor 85*c*, and abutting the oxidized isolation regions surrounding these regions, is a P+ guard ring of which cross sections 86*b* through 86*g* are shown. In some structures these guard rings may extend to the isolation PN junction. These guard rings, in one embodiment, are formed by etching the surfaces of the oxidized isolation regions prior to the removal of the nitride and immediately after the oxidized isolation regions are formed, and then diffusing the P-type impurity into the thus exposed silicon. This solves the problem discussed above in connection with region 75*d* of base 75*c* shown in FIG. 7*c*. It should be noted that the guard ring diffusion is self-aligning with respect to the oxidized isolation region and requires no additional masking step. All the other devices disclosed in this application can also be fabricated with such a self-aligned guard ring of whatever type conductivity is appropriate and with the walled emitter structure.

Furthermore, it should be noticed that in the structure of FIG. 5, a pinhole in the isolation mask might very well result in oxidizing a portion of epitaxial layer 72 to be surrounded by an emitter region. In this situation, even if the emitter region was not to abut an oxidized isolation region, the emitter in effect abuts a portion of that oxidized isolation region formed inadvertently by the pinhole. Accordingly, in carrying out the diffusion of the P+ guard ring, as discussed above in conjunction with FIG. 8, the ring will also be diffused around this spurious portion of oxidized isolation material, thereby reducing or eliminating the effect of inversion layers, depletion regions and channeling on the performance of the device.

FIG. 9 shows a unique collector sink structure made possible by this invention. P-type silicon substrate 91 has N+ buried layer 93 formed in its top surface. Silicon epitaxial layer 92 of more highly-doped N-type material is next formed on the top surface of substrate 91. Oxidized annular regions of epitaxial silicon, of which cross sections 94*a* and 94*b* are shown, define the lateral extent of isolated silicon pockets. Formed in pocket 96*a* is a collector sink 96*f*. To form this sink, a portion of the oxidized semiconductor material 94*b* adjacent this sink is etched away to expose a portion of the side of the adjacent epitaxial silicon. N-type impurities are then diffused into the exposed epitaxial semiconductor material to place a high concentration of impurities along the portion 96*f* of the epitaxial silicon exposed by etching away part 96*e* of oxidized isolation region 94*b*. This highly conductive semiconductor material contacts directly the underlying N-type collector 93. Cavity 96*e*, formed by etching away a portion of the oxidized isolation region, is limited in size such that it does not completely surround the collector sink and rather occupies only a small portion of the circumferential area of the collector sink. This allows metal contact to be made to the collector sink without having to go down into portion 96e removed by the etch and back up to the collector sink.

The five masking steps necessary to define completely the structure shown in FIG. 9 are as follows:

1. Definition of buried collector;
2. Definition of the isolation regions;
3. Definition of the emitter and collector sink regions;
4. Definition of the contact areas; and
5. Definition of the metal interconnect pattern.

Significant advantages are derived from the process and structure of this invention. One major advantage of the process is the size reduction provided by eliminating the need for clearances between the base and emitter regions and oxidized isolation regions. Using the techniques of this invention, the emitter and base regions can be formed directly abutting adjacent oxidized isolation regions.

Figure 11:
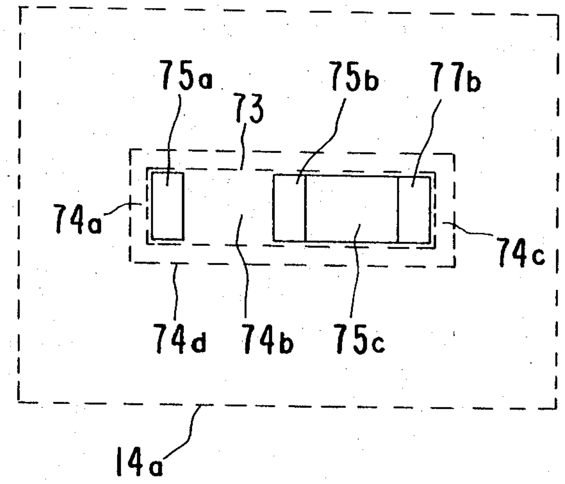
FIG. 11 illustrates the increase in packing density achieved with this invention by showing in top view the portion of the structure of FIG. 7*a* comparable to the structure shown in FIG. 2.

FIG. 11 illustrates the significant reduction in size of a transistor produced using the oxidized isolation techniques of this invention compared to a transistor produced using prior art diffused isolation techniques. FIG. 11 shows a top view of the transistor shown in FIGS. 7*a* and 7*b* placed within the diffused isolation region 14 surrounding the prior art transistor shown in top view in FIG. 2. Both structures are drawn to the same scale. As is apparent, the centerline 14*a* of the prior art diffused isolation region 14 surrounds a considerably larger area than does the centerline 74*d* of the oxidized isolation region surrounding the transistor shown in FIG. 7*a*. Shown clearly in this figure is the fact that collector contact 75*a* is adjacent oxidized isolation region 74*a*, emitter contact 75*b* is adjacent oxidized isolation region 74*b* and base contact 77*b* is adjacent oxidized isolation region 74*c*. The buried collector beneath the base emitter and collector regions is denoted by dashed line 73 shown slightly outside the base, emitter and collector contact regions. The area reduction of at least 65 percent per transistor obtained with this invention is apparent from this figure. A second advantage lies in the elimination of the detrimental effects of defects in the masks and masking procedures used to define the isolation regions and the diffused regions in the device.

If desired, the collector sink can be covered with an oxide layer at various times in the process. Placing oxide on the collector sink allows the collector sink to be used independently as a low resistivity crossunder beneath an overlying lead.

Different kinds of resistors may also be formed in the invented structure:

1. A buried collector under isolation, (FIG. 5, region 53*a*);
2. A buried collector not under isolation (FIG. 5, region 53*f*). This buried collector has a slightly lower resistivity than the buried collector under oxide;
3. Epitaxial resistors, using either P-type (FIG. 4, region 45*c*) or N-type (FIG. 5, region 55*c*) material;
4. A pinched epitaxial resistor which can be pinched by the emitter (FIG. 4, region 45*b*). Such a resistor is formed in the base region. If pinched by the base (FIG. 5, region 55*b*) the resistor is formed in the epitaxial material adjacent, and usually underneath, the base;
5. A base resistor of P-type (FIG. 5, region 56*d*) or N-type (obvious from structure with all conductivity types reversed) material;
6. Emitter resistors (made by contacting any emitter region in two places);
7. A collector sink resistor (FIG. 5, region 55*a*). All these resistors give additional design flexibility in working out optimum circuits.

While certain embodiments of this invention have been described, other related structures and processes will be obvious in view of this disclosure. In particular structures complimentary to those described in this specification can be obtained by reversing the conductivity type of each region in each structure.

What is claimed is:

1. A silicon structure comprising:

a semiconductor silicon substrate;

a semiconductor silicon epitaxial layer upon one surface of said substrate, said epitaxial layer having a substantially flat top surface; and a PN isolation junction extending laterally along the structure forming an isolation barrier between regions of said substrate and layer;

said epitaxial layer comprising epitaxial silicon pockets laterally spaced from each other and annular-shaped regions formed of oxidized portions of silicon material surrounding each pocket, said annular-shaped regions extending through said epitaxial layer to said PN isolation junction and together therewith electrically isolating said epitaxial silicon pockets from each other, and the top surface of said annular-shaped regions being substantially coplanar with the top surface of said epitaxial layer.

2. Structure as in claim 1 wherein said substrate is of one conductivity type and said epitaxial layer of semiconductor material is also of said one conductivity type.

3. Structure as in claim 2 wherein said substrate is of P-type conductivity.

4. Structure as in claim 2 wherein said substrate is of N-type conductivity.

5. Structure as in claim 3 wherein said substrate contains a plurality of low resistivity regions of N-type conductivity formed in the surface of said substrate directly beneath said epitaxial layer.

6. Structure as in claim 4 wherein said substrate contains a plurality of low resistivity regions of P-type conductivity formed in the surface of said substrate directly beneath said epitaxial layer.

7. Structure as in claim 1 wherein said substrate is of one type conductivity and said epitaxial layer is of the opposite type conductivity.

8. Structure as in claim 7 wherein said substrate contains a plurality of low resistivity regions of opposite type conductivity formed in the surface of said substrate directly beneath said epitaxial layer.

9. Structure as in claim 7 wherein said substrate contains a plurality of low resistivity regions of said one type conductivity formed in the surface of said substrate directly beneath said epitaxial layer.

10. Structure as in claim 7 wherein said substrate is of P-type conductivity.

11. Structure as in claim 7 wherein said substrate is of N-type conductivity.

12. Structure as in claim 1 wherein each pocket of epitaxial semiconductor material contains selected regions of differing conductivity type.

13. Structure as in claim 12 wherein said regions of differing conductivity type comprise active and passive semiconductor devices.

14. Structure as in claim 12 including regions of low resistivity formed in the underlying substrate to interconnect regions separated by oxidized isolation regions.

15. Structure as in claim 1 wherein said epitaxial layer has a thickness of less than 5 microns.

16. Structure as in claim 1 wherein said epitaxial layer has a thickness of 1.25 microns.

17. Structure as in claim 7 including a low resistivity first region of opposite conductivity type formed in said substrate adjacent to said epitaxial layer of semiconductor material, and a low resistivity second region of opposite conductivity type, said second region extending from the surface of said epitaxial layer into contact with said low resistivity first region, said second region being surrounded by an annular-shaped oxidized isolation region extending through said epitaxial layer to said first region in said substrate.

18. Structure as in claim 17 wherein said first region extends underneath a portion of said oxidized isolation region and into contact with another adjacent region of epitaxial silicon.

19. Structure as in claim 17 wherein said adjacent region of epitaxial silicon comprises:

a collector region of opposite conductivity type contacting said first region;

a base region of one conducitvity type extending to the annular-shaped oxidized isolation region surrounding said adjacent region of epitaxial silicon; and an emitter region formed of opposite conductivity type in said base region.

20. Structure as in claim 19 wherein said emitter region abuts a portion of the annular-shaped oxidized isolation region surrounding said adjacent epitaxial region of silicon.

21. Structure as in claim 20 wherein the surface of said epitaxial silicon is covered by an insulating layer containing therein windows through which a separate first contact is made to each of said second region, said base region and said emitter region.

22. Structure as in claim 21 including a second contact to said second region and a third contact to said second region, said second and third contacts being separated by a selected distance thereby to form a resistive path from said second contact to said third contact through the said second region.

23. Structure as in claim 21 including a second contact to said base region and a third contact to said base region, said second and third contacts to said base region being separated by a selective distance thereby to form a base resistor between said second contact and said third contact to said base region.

24. Structure as in claim 21 wherein two windows are formed in the insulation overlying a pocket of epitaxial silicon thereby to form an epitaxial resistor from the epitaxial silicon between said two contacts.

* * * * *